(12) United States Patent
Mahalingam et al.

(10) Patent No.: US 10,806,054 B1
(45) Date of Patent: Oct. 13, 2020

(54) FLEXIBLE ELASTIC THERMAL BRIDGE FOR ELECTRONIC SUBASSEMBLIES WITH VARIABLE GAPS BETWEEN COMPONENTS AND ENCLOSURES

(71) Applicant: HONEYWELL INTERNATIONAL INC., Morris Plains, NJ (US)

(72) Inventors: Saravanakumar Mahalingam, Bangalore (IN); NSV Sarveswara Sarma A, Bangalore (IN); D Chandra Mohan Vyas, Bangalore (IN); Ravi Radhakrishnan, Bangalore (IN); Mathews Kuriakose, Bangalore (IN)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 0 days.

(21) Appl. No.: 16/533,234

(22) Filed: Aug. 6, 2019

(51) Int. Cl.
| | |
|---|---|
| *H05K 7/20* | (2006.01) |
| *H05K 7/14* | (2006.01) |
| *H05K 1/02* | (2006.01) |
| *H05K 1/18* | (2006.01) |

(52) U.S. Cl.
CPC ....... *H05K 7/20454* (2013.01); *H05K 1/0203* (2013.01); *H05K 1/181* (2013.01); *H05K 7/1427* (2013.01); *H05K 7/2049* (2013.01); *F28F 2255/02* (2013.01); *F28F 2255/04* (2013.01)

(58) Field of Classification Search
CPC .............. H05K 7/20454; H05K 7/2049; H01L 23/40–4012; F28F 2255/02; F28F 2255/04
See application file for complete search history.

(56) References Cited

U.S. PATENT DOCUMENTS

| | | | | | |
|---|---|---|---|---|---|
| 3,212,564 | A | * | 10/1965 | Passman | ............. H01L 23/3672 165/47 |
| 4,448,240 | A | * | 5/1984 | Sharon | ................ H01L 23/4338 165/185 |
| 5,528,456 | A | * | 6/1996 | Takahashi | ........... H01L 23/3675 165/185 |

(Continued)

FOREIGN PATENT DOCUMENTS

| | | |
|---|---|---|
| CN | 104217894 B | 7/2016 |
| WO | 2012058926 A1 | 5/2012 |

*Primary Examiner* — Robert J Hoffberg
(74) *Attorney, Agent, or Firm* — Lorenz & Kopf, LLP

(57) ABSTRACT

An electronic subassembly includes an enclosure, a circuit board, a plurality of electronic components, and a plurality of flexible elastic thermal elements. Each flexible elastic thermal bridge is disposed in the gap between a different one of the electronic components and a first wall of the enclosure. Each flexible elastic thermal bridge includes a first thermally conductive metallic structure, a second thermally conductive metal structure, and an elastically deflectable thermal element. The first thermally conductive metallic structure contacts the first wall. The second thermally conductive metallic structure contacts the top surface of the electronic component and is spaced apart from the first thermally conductive metallic structure to define a void. The elastically deflectable thermal element is disposed in the void and directly contacts both the first thermally conductive metallic structure and the second thermally conductive metallic structure. The elastically deflectable thermal element comprises at least one thermally conductive material.

20 Claims, 3 Drawing Sheets

(56) References Cited

U.S. PATENT DOCUMENTS

| | | | | |
|---|---|---|---|---|
| 5,552,960 A * | 9/1996 | Nelson | | G06F 1/203 |
| | | | | 165/104.33 |
| 5,754,400 A * | 5/1998 | Sathe | | H01L 23/4006 |
| | | | | 257/718 |
| 5,823,518 A * | 10/1998 | Nagamitsu | | F16F 1/122 |
| | | | | 267/291 |
| 6,259,602 B1 * | 7/2001 | Malhammar | | H01L 23/3672 |
| | | | | 165/185 |
| 6,411,513 B1 * | 6/2002 | Bedard | | H01L 23/3672 |
| | | | | 165/185 |
| 6,472,742 B1 * | 10/2002 | Bhatia | | H01L 23/40 |
| | | | | 257/706 |
| 6,501,658 B2 * | 12/2002 | Pearson | | H01L 23/4093 |
| | | | | 174/16.3 |
| 6,765,798 B1 | 7/2004 | Ratliff et al. | | |
| 6,939,742 B2 * | 9/2005 | Bhatia | | H01L 23/40 |
| | | | | 257/706 |
| 7,096,926 B2 * | 8/2006 | Belady | | F28F 23/00 |
| | | | | 165/104.21 |
| 7,916,485 B2 * | 3/2011 | Yu | | F28F 3/02 |
| | | | | 165/104.26 |
| 7,990,717 B2 * | 8/2011 | Zhu | | F28F 3/02 |
| | | | | 165/185 |
| 8,270,170 B2 * | 9/2012 | Hughes | | H05K 7/20445 |
| | | | | 165/104.33 |
| 9,750,127 B2 | 8/2017 | Kim et al. | | |
| 10,109,556 B2 * | 10/2018 | Joshi | | H01L 23/40 |
| 10,408,577 B2 * | 9/2019 | Pepka | | F41H 5/007 |
| 10,649,490 B2 * | 5/2020 | Blattel | | A45C 13/02 |
| 2006/0087816 A1 * | 4/2006 | Ewes | | F28F 3/02 |
| | | | | 361/704 |
| 2006/0215368 A1 * | 9/2006 | Tsai | | H01L 23/433 |
| | | | | 361/704 |
| 2010/0157540 A1 * | 6/2010 | Yu | | H01L 23/433 |
| | | | | 361/710 |
| 2010/0246136 A1 * | 9/2010 | Yu | | H01L 23/367 |
| | | | | 361/710 |
| 2019/0289745 A1 * | 9/2019 | Palle | | F28F 1/02 |
| 2020/0045850 A1 * | 2/2020 | Bala | | H01L 23/40 |

* cited by examiner

FLEXIBLE ELASTIC THERMAL BRIDGE FOR ELECTRONIC SUBASSEMBLIES WITH VARIABLE GAPS BETWEEN COMPONENTS AND ENCLOSURES

TECHNICAL FIELD

The present invention generally relates to electronic subassemblies, and more particularly relates to flexible electronic thermal bridges for use in electronic subassembly enclosures.

BACKGROUND

Heat is generated in electronics enclosures. As such, it is essential to conduct heat away from electronic components disposed within the enclosures. For applications in which direct forced air or liquid cooling are not possible, a Thermal Interface Material (TIM) is often used to transfer heat from the components to the enclosure wall without altering the device's physical properties or affecting product performance. In many instances, there are variable gaps within the same enclosure between the components and enclosure wall. Thus, the TIM thicknesses also vary.

Typically, TIMs can be used in applications where the gap between the component and the enclosure is between 1 to 5 mm. For larger gaps, the thermal resistance across the TIM can becomes large which affects the component temperature, performance, and reliability.

Hence, there is a need for a single device that can be used to transfer heat from electronic components to enclosure walls even when the gaps vary between the components and the wall.

BRIEF SUMMARY

This summary is provided to describe select concepts in a simplified form that are further described in the Detailed Description. This summary is not intended to identify key or essential features of the claimed subject matter, nor is it intended to be used as an aid in determining the scope of the claimed subject matter.

In one embodiment, an electronic subassembly includes an enclosure, a circuit board, a plurality of electronic components, and a plurality of flexible elastic thermal elements. The enclosure has at least a first wall and a second wall, and the first and second walls are spaced apart from each other to define a cavity. The circuit board is disposed within the cavity and is spaced apart from the first wall. Each electronic component has a top surface that is spaced apart from the first wall to thereby define a gap between each top surface and the first wall, wherein at least two of the gaps are unequal. Each flexible elastic thermal bridge is disposed in the gap between a different one of the electronic components and the first wall, and each flexible elastic thermal bridge includes a first thermally conductive metallic structure, a second thermally conductive metal structure, and an elastically deflectable thermal element. The first thermally conductive metallic structure contacts the first wall. The second thermally conductive metallic structure contacts the top surface of the electronic component and is spaced apart from the first thermally conductive metallic structure to define a void. The elastically deflectable thermal element is disposed in the void and directly contacts both the first thermally conductive metallic structure and the second thermally conductive metallic structure. The elastically deflectable thermal element comprises at least one thermally conductive material.

In another embodiment, an electronic subassembly includes an enclosure, a circuit board, a plurality of electronic components, and a plurality of flexible elastic thermal elements. The enclosure has at least a first wall and a second wall, and the first and second walls are spaced apart from each other to define a cavity. The circuit board is disposed within the cavity and is spaced apart from the first wall. Each electronic component has a top surface that is spaced apart from the first wall to thereby define a gap between each top surface and the first wall, wherein at least two of the gaps are unequal. Each flexible elastic thermal bridge is disposed in the gap between a different one of the electronic components and the first wall, and each flexible elastic thermal bridge includes a first thermally conductive metallic structure, a second thermally conductive metal structure, an elastically deflectable thermal element, and a plurality of resilient components. The first thermally conductive metallic structure contacts the first wall. The second thermally conductive metallic structure contacts the top surface of the electronic component and is spaced apart from the first thermally conductive metallic structure to define a void. The elastically deflectable thermal element is disposed in the void and directly contacts both the first thermally conductive metallic structure and the second thermally conductive metallic structure. The elastically deflectable thermal element comprises at least one thermally conductive material and has a cross-sectional shape that is polygonal. Each resilient component is disposed between and engages the first and second thermally conductive metallic structures. Each resilient component supplies a bias force to the first and second thermally conductive metallic structures that urges them into contact with the first wall and the circuit board, respectively.

Furthermore, other desirable features and characteristics of the electronic subassembly will become apparent from the subsequent detailed description and the appended claims, taken in conjunction with the accompanying drawings and the preceding background.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

Figure 1:
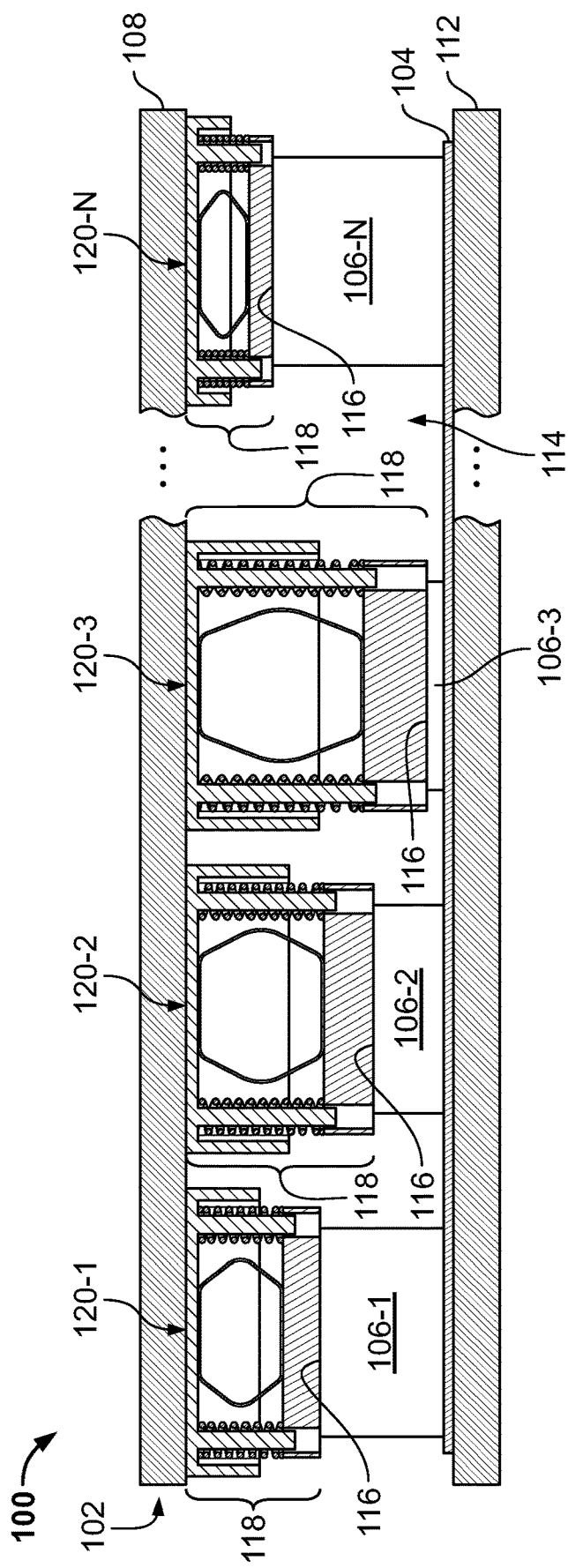
FIG. 1 a simplified cross section view of one embodiment of an electronic subassembly.

Referring now to FIG. 1, a simplified cross section view of one embodiment of an electronic subassembly 100 is depicted. The depicted electronic subassembly 100 includes at least an enclosure 102, a circuit board 104, and a plurality of electronic components 106 (e.g., 106-1, 106-2, 106-3 . . . 106-N). The enclosure 102 may be variously configured and implemented, but it includes at least a first wall 108 and a second wall 112. As FIG. 1 further depicts, the first and second walls 108, 112 are spaced apart from each other to define a cavity 114.

The circuit board 104 is disposed within the cavity 114. In the depicted embodiment, the circuit board 104 is mounted on the second wall 112 and is spaced apart from the first wall 108. In other embodiments, however, the circuit board 104 may be mounted on the first wall 108 and be spaced apart from the second wall 112. Moreover, although the circuit board 104 is, for ease of illustration, depicted as being mounted directly on the second wall 112, it may, at least in some embodiments, be mounted slightly offset from the second wall 112 via, for example, non-illustrated offset mount hardware.

Regardless of how the circuit board 104 is mounted in the enclosure cavity 114, the electronic components 106 are each mounted on the circuit board 104 using any one of numerous known mounting techniques. Each of the depicted electronic components 106 has a top surface 116 that is spaced apart from the first wall 108. As such, a gap 118 is defined between the first wall 108 and each of the top surfaces 116. The gaps 118 may be equal or unequal. In the depicted embodiment, all of the gaps are unequal. However, this is merely illustrative of one embodiment, and it will be appreciated that in general at least two of the gaps will be unequal. It will additionally be appreciated that the disparity in the gaps 118 depicted in FIG. 1 is somewhat exaggerated and not drawn to scale. This is done merely to more clearly depict the efficacy of the disclosed inventive concept. Moreover, various other circuit components that are not depicted in FIG. 1 may be mounted on the circuit board 104. For clarity and ease of illustration, these other circuit components are not shown or further described.

The electronic components 106 that are depicted in FIG. 1 may be implemented using any one of numerous electronic circuit packages and/or integrated circuits. No matter the specific implementation, when energized each electronic component generates heat that is sufficient to rely on a heat sinking device to draw heat away from the electronic components 106. As is known, in currently known electronic subassemblies a Thermal Interface Material (TIM) is often used to transfer heat from the electronic components 106 to the first wall 108. However, with relatively large gaps, the thermal resistance across the TIM can becomes large which affects the component temperature, performance, and reliability, and with variable sized gaps, the number of differently sized TIMs can impact cost. To alleviate these drawbacks, but provide the heat sinking functionality of a TIM, the depicted electronic subassembly additionally includes a plurality of flexible elastic thermal bridges 120 (e.g., 120-1, 120-2, 120-3 . . . 120-N).

The flexible elastic thermal bridges 120 are disposed within the cavity 114. More specifically, each flexible elastic thermal bridge 120 is disposed in the gap 118 between a different one of the electronic components 106 and the first wall 108. The flexible elastic thermal bridges 120 are identical. However, as FIG. 1 depicts, each is disposed within a different sized gap 118. Nonetheless, each of the flexible elastic thermal bridges 120 function identically to draw heat away from its associated electronic component 106. The configuration of the flexible elastic thermal bridge 120 that allows this functionality will now be described with reference to FIGS. 2 and 3.

Figure 2:
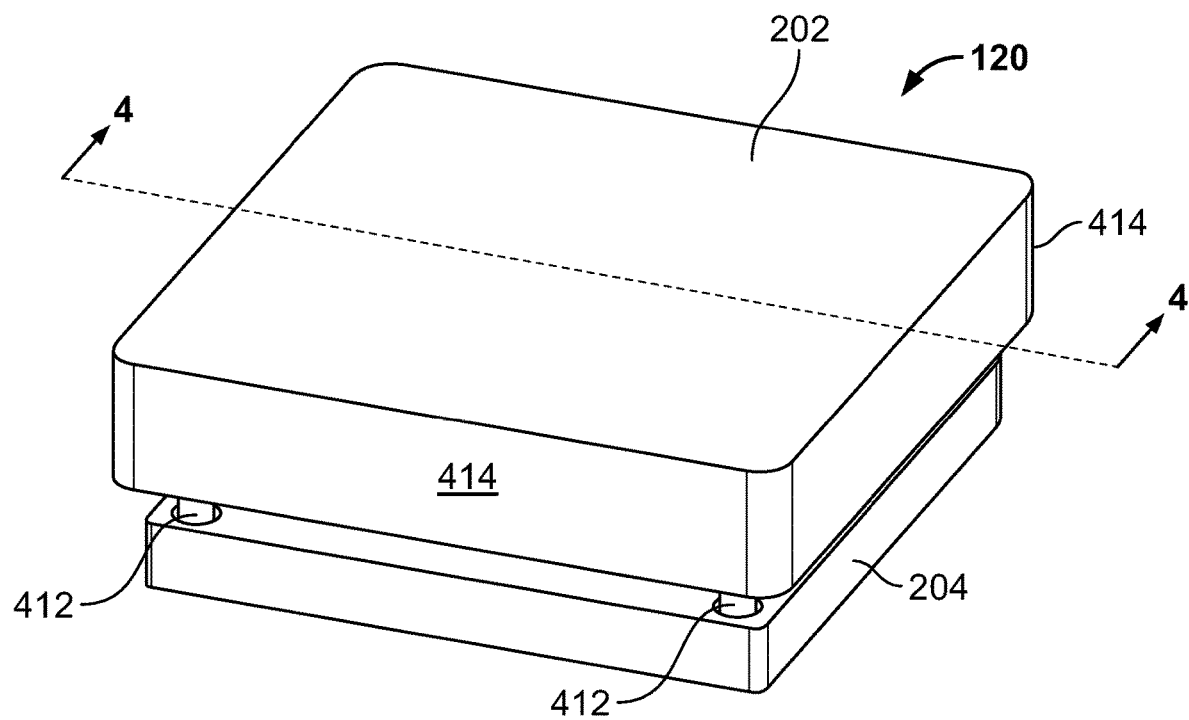
FIG. 2 depicts a plan view of one embodiment of a flexible elastic thermal bridge that may be used in the electronic subassembly of FIG. 1.
Figure 3:
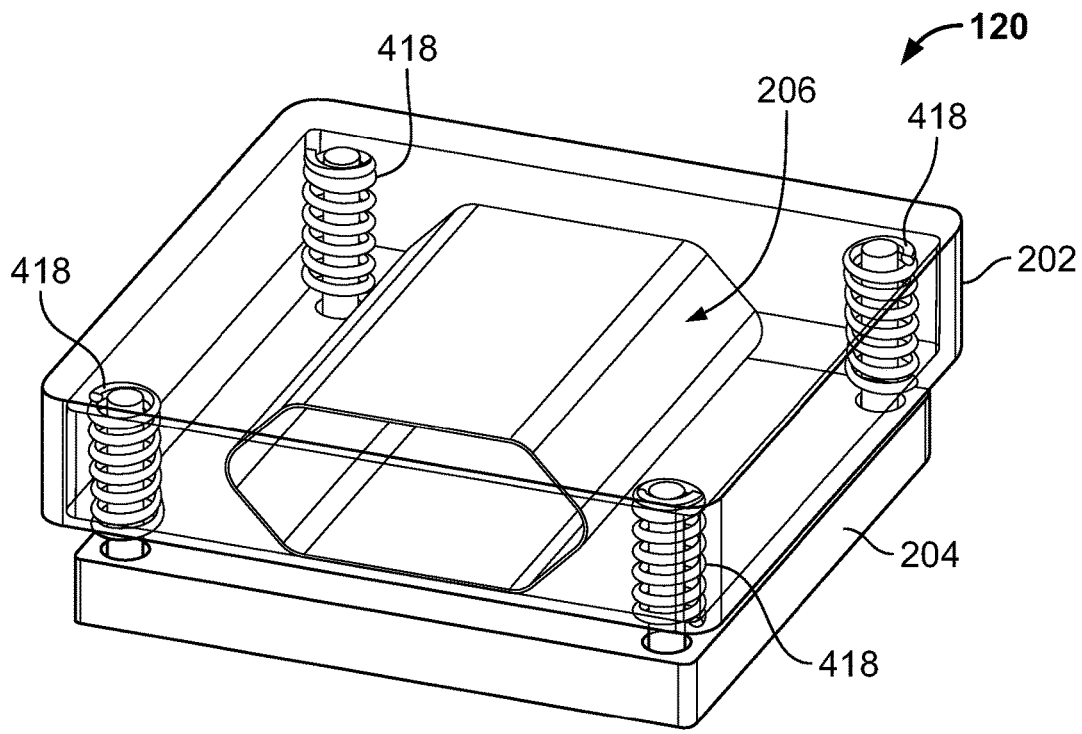
FIG. 3 depicts a side view of the flexible elastic thermal bridge of FIG. 2.
Figure 4:
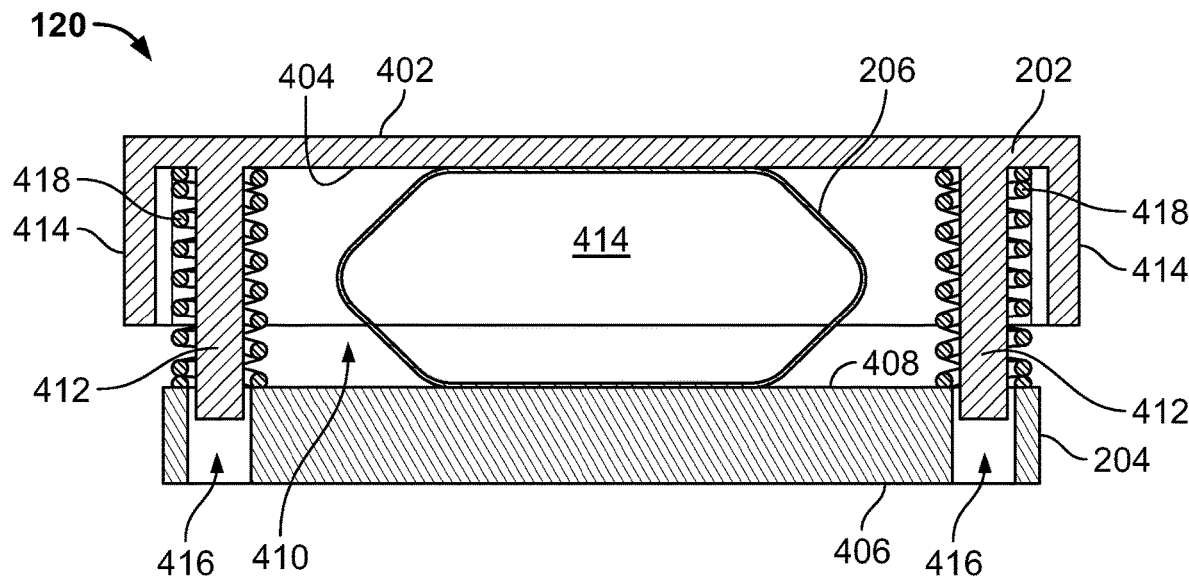
FIG. 4 depicts a cutaway view of the flexible elastic thermal bridge along line 4-4 in FIG. 2.

As shown more clearly in FIGS. 2-4, each flexible elastic thermal bridge 120 includes a first thermally conductive metallic structure 202, a second thermally conductive metallic structure 204, and an elastically deflectable thermal element 206. As shown most clearly in FIG. 4, the first thermally conductive structure 202 includes a first outer surface 402 and first inner surface 404, and the second thermally conductive structure includes a second outer surface 406 and a second inner surface 408. With quick reference back to FIG. 1, it is seen that when flexible elastic thermal bridge 120 is installed, the first outer surface 402 of the first thermally conductive metallic structure 202 contacts the first wall 108, and the second outer surface 406 of the second thermally conductive metallic structure 204 contacts the top surface 116 of its associated electronic component 106. As such, and with reference back to FIG., the first and second thermally conductive metallic structures 202, 204 are spaced apart each other to define a void 410.

It will be appreciated that the first and second thermally conductive metallic structures 202, 204 may be comprised of any one of numerous metallic materials. Moreover, the first and second thermally conductive metallic structures 202, 204 may be comprised of an identical metallic material or of different metallic materials (i.e., a first metallic material and a second metallic material). Some non-limiting examples of suitable metallic materials include aluminum and copper, just to name a few.

The elastically deflectable thermal element 206 is disposed in the void 410 defined between the first and second thermally conductive metallic structures 202, 204, and it directly contacts both the first and second thermally conductive metallic structures 202, 204. More specifically, it directly contacts the first inner surfaces 404, 408 of the first and second thermally conductive metallic structures 202, 204. Because it is elastically deflectable, the elastically deflectable thermal element 206 is capable of expanding and contracting, as needed, so that the flexible elastic thermal bridge 120 can adapt to, and function with, the differently dimensioned gaps 118. It will be appreciated that the elastically deflectable thermal element 206 may comprise one or more thermally conductive materials and may be variously shaped. Before discussing the materials and shapes further, however, some optional configurations and additional components will first be described.

In particular, in the embodiment depicted in FIGS. 2-4, the first thermally conductive metallic structure 202 includes a plurality of posts 412 and a plurality of sides 414 that partially surrounds the posts 412. the second thermally conductive structure 204 includes a plurality of openings 416, and the flexible elastic thermal bridge 120 additionally includes a plurality of resilient components 418. Each of the posts 412 extend perpendicularly from the first inner surface 404 of the first thermally conductive structure 202. It will be appreciated that the number of posts 412 may vary, but in the depicted embodiment there are four posts 412.

Each of the openings 416 is formed in the second thermally conductive metal structure 204 and each extends between the second outer and inner surfaces 406, 408. Moreover, each opening 416 is located and dimensioned to allow one of the posts 412 to be inserted into and removed therefrom as needed.

Each of the resilient components 418 is disposed about a different one of the posts 412 and engages the first and second thermally conductive metallic structures 202, 204. More specifically, each resilient component engages first and second inner surfaces 404, 408 of the first and second thermally conductive metallic structures 202, 204, respectively. Moreover, each resilient components 418 supplies a bias force to the first and second thermally conductive metallic structures 202, 202 that, when installed in the enclosure, 102 urges them into contact with the first wall 108 and the top surface 116 of its associated component 106. The number and type of resilient elements 418 may vary. In the depicted embodiment, however, in which the first and second thermally conductive metallic structures 202, 204 each have four posts 412 and openings 416, respectively, there are four resilient components 418. In the depicted embodiment, each of the resilient components 212 is implemented using a coil spring; however, other types of springs, such as differential springs and leaf springs could also be used.

Figure 5:
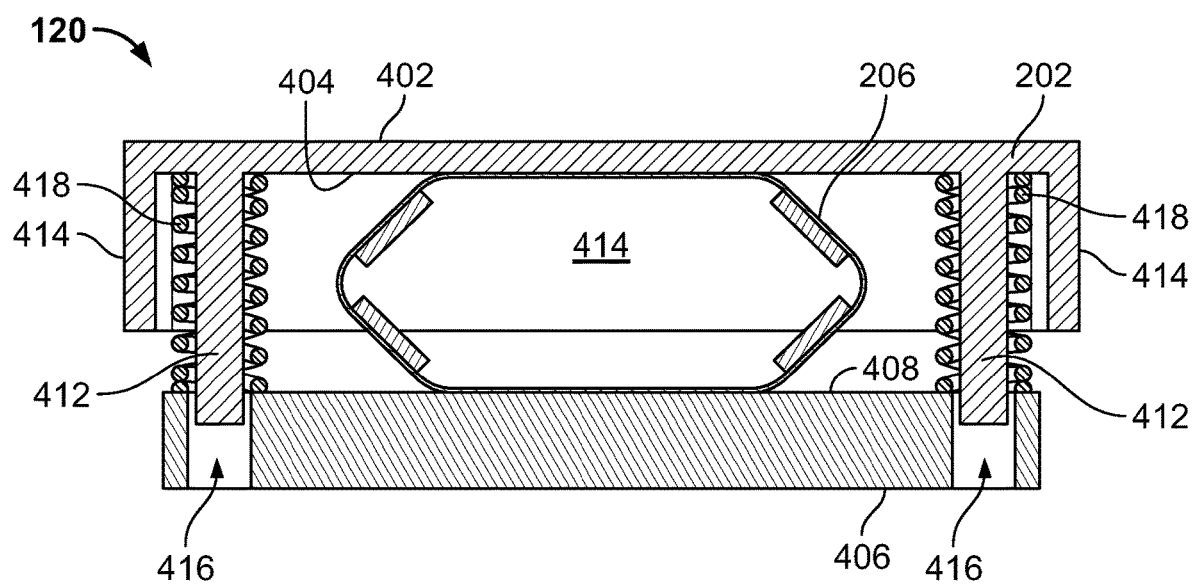
FIG. 5 depicts a cutaway view, similar to that of FIG. 4, but with another embodiment of the elastically deflectable thermal element.

As previously noted, the elastically deflectable thermal element 206 may be formed of one or more thermally conductive materials. In some embodiments the elastically deflectable thermal element 206 is formed of a single metal, in other embodiments it is formed of a metal alloy, in still other embodiments it is formed as a bimetallic element. When formed of a single metal or a metal alloy, some suitable metals and metal alloys include, but are not limited to, copper, graphite, beryllium-copper, and any one of numerous composites with relatively high thermal conductivity and relatively low Young's modulus could be used. When the elastically deflectable thermal element 206 is formed as a bimetallic element, the bimetal materials may include beryllium-copper and copper, beryllium-copper and graphite, and copper and aluminum, just to name a few. For completeness, a cross section view of the flexible elastic thermal bridge 120 when the elastically deflectable thermal element 206 is formed as a bimetallic element is depicted in FIG. 5.

It was additionally noted above that the elastically deflectable thermal element 206 may be variously shaped. Although the elastically deflectable thermal element 206 will generally have a polygonal cross-sectional shape, in the depicted embodiment its cross-sectional shape is of an irregular hexagon. It will additionally be appreciated that the elastically deflectable thermal element 206 may be formed of a single component or from two or more components.

Thermal simulations were conducted for various embodiments of the flexible elastic thermal bridge 120 and were compared to thermal simulations for a conventional TIM. Different materials and configurations for the elastically deflectable thermal element 206 were used. In particular, one simulation used an elastically deflectable thermal element 206 made of copper (Cu) and having a thickness of 0.2 mm, a second simulation used an elastically deflectable thermal element 206 made of beryllium-copper (Be—Cu) and having a thickness of 0.2 mm, a third simulation used an elastically deflectable thermal element 206 made of graphite (C) and having a thickness of 0.2 mm, fourth and fifth simulations used an elastically deflectable thermal element 206 formed as a bimetallic element. In the fourth simulation, the elastically deflectable thermal element 206 was made of Be—Cu at a thickness of 0.2 mm and Cu at thickness of 0.4 mm. In the fifth simulation, the elastically deflectable thermal element 206 was made of Be—Cu at a thickness of 0.2 mm and C at thickness of 0.4 mm.

The thermal simulations were conducted assuming the gap 118 between the first wall 108 and the top surface 116 of the electronic component 106 is 10 mm. The electronic component 106 was simulated as being 5 mm×5 mm×1 mm in size and disposed on the circuit board 104, and generating 1 W of heat. The simulations additionally assume the use of a conventional 10 mm TIM that has a thermal conductivity of 5 W/mK, that the enclosure 102 has a convective heat transfer coefficient of 10 W/m²K, that the circuit board 104 has a thermal conductivity of 20 W/mK in the x- and y-directions (e.g., length and width) and 0.25 W/mK in the z-direction (e.g., thickness), and that the ambient temperature is 55° C.

The results if these simulations show unexpectedly improved results for the flexible elastic thermal bridge 120. In particular, as shown in Table I below, with the conventional TIM, the temperature of the component 106 reached 97.41° C. and the temperature differential across the TIM was 11.77° C. Conversely, each of the different flexible elastic thermal bridges 120 (with the exception of the Be—Cu foil) showed significantly and unexpectedly lower component temperatures and temperature differentials.

TABLE I

| TYPE | COMPONENT TEMP (° C.) | COMPONENT DIFFERENTIAL TEMP (° C.) |
| --- | --- | --- |
| Conventional TIM | 97.41 | 11.77 |
| Cu (0.2 mm foil) | 90.19 | 2.98 |
| Be-Cu (0.2 mm foil) | 99.25 | 14.31 |
| Be-Cu (0.2mm foil) + Cu (0.4 mm) | 91.35 | 4.41 |
| Be-Cu (0.2 mm foil) + Graphite (0.4 mm) | 91.14 | 4.51 |

In a particular preferred (though not limiting) embodiment, the flexible elastic thermal bridge 120 described herein can fit into any gap 118 in the range of 5 mm to 12 mm. This lowers the product cost as there is no requirement for procuring different thickness TIMs which increases overall cost. This also effectively reduces the assembly time of the product. Studies show the flexible elastic thermal bridge 120, for the same gap 118 and component power dissipation, provides significant and unexpected thermal performance as compared to that of a conventional TIM.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. An electronic subassembly, comprising:
   an enclosure having at least a first wall and a second wall, the first and second wall spaced apart from each other to define a cavity;
   a circuit board disposed within the cavity and spaced apart from the first wall;
   a plurality of electronic components mounted on the circuit board, each of the electronic components having a top surface that is spaced apart from the first wall to thereby define a gap between each top surface and the first wall, wherein at least two of the gaps are unequal; and
   a plurality of flexible elastic thermal bridges disposed within the cavity, each of the flexible elastic thermal bridges disposed in the gap between a different one of the electronic components and the first wall, each of the flexible elastic thermal bridges comprising:
      a first thermally conductive metallic structure contacting the first wall,
      a second thermally conductive metallic structure contacting the top surface of a respective one of the electronic components, the second thermally conductive metallic structure spaced apart from the first thermally conductive metallic structure to define a void,
      an elastically deflectable thermal element disposed in the void and directly contacting both the first thermally conductive metallic structure and the second thermally conductive metallic structure, the elastically deflectable thermal element comprising at least one thermally conductive material,
   a plurality of resilient components disposed between and engaging the first and second thermally conductive metallic structures, the plurality of resilient components supplying a bias force to the first and second thermally conductive metallic structures that urges the first and second thermally conductive metallic structures into contact with the first wall and the circuit board, respectively,
   a plurality of posts extending from a first inner surface of the first thermally conductive metallic structure; and
   a plurality of openings formed in the second thermally conductive metallic structure,
   wherein each of the plurality of resilient components is disposed around a different one of the posts.

2. The electronic subassembly of claim 1, wherein each of the resilient components is a coil spring.

3. The electronic subassembly of claim 1, wherein the first thermally conductive metallic structure and the second thermally conductive metallic structure are comprised of an identical metallic material.

4. The electronic subassembly of claim 1, wherein:
   the first thermally conductive metallic structure is comprised of a first metallic material; and
   the second thermally conductive metallic structure is comprised of a second metallic material that is different from the first metallic material.

5. The electronic subassembly of claim 1, wherein the at least one thermally conductive material comprises copper.

6. The electronic subassembly of claim 1, wherein the at least one thermally conductive material comprises graphite.

7. The electronic subassembly of claim 1, wherein the at least one thermally conductive material comprises a metal alloy.

8. The electronic subassembly of claim 7, wherein the metal alloy comprises beryllium-copper.

9. The electronic subassembly of claim 1, wherein the elastically deflectable thermal element comprises a bimetallic element.

10. The electronic subassembly of claim 9, wherein the bimetallic element comprises beryllium-copper and copper.

11. The electronic subassembly of claim 9, wherein the bimetallic element comprises beryllium-copper and graphite.

12. The electronic subassembly of claim 1, wherein:
    the elastically deflectable thermal element has a cross-sectional shape; and
    the cross-sectional shape is polygonal.

13. The electronic subassembly of claim 12, wherein the polygonal is an irregular hexagon.

14. An electronic subassembly, comprising:
    an enclosure having at least a first wall and a second wall, the first and second wall spaced apart from each other to define a cavity;
    a circuit board disposed within the cavity and spaced apart from the first wall;
    a plurality of electronic components mounted on the circuit board, each of the electronic components having a top surface that is spaced apart from the first wall to thereby define a gap between each top surface and the first wall, wherein at least two of the gaps are unequal; and
    a plurality of flexible elastic thermal bridges disposed within the cavity, each of the flexible elastic thermal bridges disposed in the gap between a different one of the electronic components and the first wall, each of the flexible elastic thermal bridges comprising:
       a first thermally conductive metallic structure contacting the first wall, the first thermally conductive metallic structure comprising a first metallic material,
       a second thermally conductive metallic structure contacting the top surface of a respective one of the electronic components, the second thermally conductive metallic structure spaced apart from the first thermally conductive metallic structure to define a void, the second thermally conductive structure comprising the first metallic material,
       an elastically deflectable thermal element disposed in the void and directly contacting both the first thermally conductive metallic structure and the second thermally conductive metallic structure, the elastically deflectable thermal element comprising at least one thermally conductive material and having a cross-sectional shape that is polygonal,
a plurality of resilient components disposed between and engaging the first and second thermally conductive metallic structures, the plurality of resilient components supplying a bias force to the first and second thermally conductive metallic structures that urges the first and second thermally conductive metallic structures into contact with the first wall and the circuit board, respectively
a plurality of posts extending from a first inner surface of the first thermally conductive metallic structure; and
a plurality of openings formed in the second thermally conductive metallic structure,
wherein each of the plurality of resilient components is disposed around a different one of the posts.

15. The electronic subassembly of claim 14, wherein each of the resilient components is a coil spring.

16. The electronic subassembly of claim 14, wherein the at least one thermally conductive material is selected from the group consisting of copper, graphite, and a metal alloy.

17. The electronic subassembly of claim 14, wherein the elastically deflectable thermal element comprises a bimetallic element.

18. The electronic subassembly of claim 17, wherein the bimetallic element comprises beryllium-copper and copper.

19. The electronic subassembly of claim 17, wherein the bimetallic element comprises beryllium-copper and graphite.

20. The electronic subassembly of claim 14, wherein the polygonal is an irregular hexagon.

\* \* \* \* \*